United States Patent
Kim

(10) Patent No.: US 8,754,430 B2
(45) Date of Patent: Jun. 17, 2014

(54) LIGHT EMITTING DEVICE AND LIGHT EMITTING DEVICE PACKAGE

(75) Inventor: Jae Hoon Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 81 days.

(21) Appl. No.: 13/367,101

(22) Filed: Feb. 6, 2012

(65) Prior Publication Data

US 2012/0138993 A1    Jun. 7, 2012

(30) Foreign Application Priority Data

Jun. 2, 2011    (KR) .................. 10-2011-0053181

(51) Int. Cl.
H01L 33/00    (2010.01)

(52) U.S. Cl.
USPC .............. 257/98; 257/76; 257/194; 257/615; 257/89; 257/79; 257/E21.599; 257/E29.089; 257/E27.121; 257/E21.09; 257/E33.072; 438/694; 438/47

(58) Field of Classification Search
USPC .............. 257/76, 194, 615, 79, 89, 98, 100; 438/46, 694
See application file for complete search history.

(56) References Cited

U.S. PATENT DOCUMENTS

2005/0199901 A1\* 9/2005 Ueda .............................. 257/103
2008/0308823 A1\* 12/2008 Kamii et al. .................... 257/94

OTHER PUBLICATIONS

Michael Shur et al., "Deep-Ultraviolet Light-Emitting Diodes," IEEE Transactions on Electronic Devices, vol. 57, No. 1, Jan. 2010; pp. 12-24.\*

\* cited by examiner

*Primary Examiner* — Jerome Jackson, Jr.
*Assistant Examiner* — Bo Fan
(74) *Attorney, Agent, or Firm* — KED & Associates LLP

(57) ABSTRACT

A light emitting device is disclosed. The light emitting device includes a first conductive type semiconductor layer, an active layer disposed on the first conductive type semiconductor layer, a tunnel junction layer comprising a second conductive type nitride semiconductor layer and a first conductive type nitride semiconductor layer disposed on the active layer, wherein the first conductive type nitride semiconductor layer and the second conductive type nitride semiconductor layer are PN junctioned, a first electrode disposed on the first conductive type semiconductor layer, and a second electrode disposed on the first conductive type nitride semiconductor layer, wherein a portion of the second electrode is in schottky contact with the second conductive type nitride semiconductor layer through the first conductive type nitride semiconductor layer.

12 Claims, 9 Drawing Sheets

LIGHT EMITTING DEVICE AND LIGHT EMITTING DEVICE PACKAGE

CROSS REFERENCE TO RELATED APPLICATION

This application claims priority under 35 U.S.C. §119 to Korean Patent Application No. 10-2011-0053181, filed in Korea on Jun. 2, 2011, which is hereby incorporated in its entirety by reference as if fully set forth herein.

TECHNICAL FIELD

Embodiments relate to a light emitting device and light emitting device package.

BACKGROUND

Generally, a light emitting diode (hereinafter, referred to as an 'LED') is a semiconductor device that converts an electrical signal into infrared light, visible light or other forms of light using recombination between electrons and holes, which is one of the properties of a compound semiconductor, to transmit and receive the signal.

Generally, the LED is used in electric home appliances, a remote controller, an electric bulletin board, an indicator, various kinds of automated equipment, optical communication, etc. The LED may be classified as an infrared emitting diode (IRED) or a visible light emitting diode (VLED).

A frequency (or wavelength) of light emitted from the LED is a function to a band gap of a semiconductor material. If a semiconductor material having a narrow band gap is used, photons having low energy and a long wavelength are generated. On the other hand, if a semiconductor material having a wide band gap is used, photons having a short wavelength are generated. Consequently, a semiconductor material for a device is selected based on kinds of light to be emitted.

SUMMARY

Embodiments provide a light emitting device and light emitting device package with improved reflectance and optical extraction efficiency.

In one embodiment, a light emitting device includes a first conductive type semiconductor layer, an active layer disposed on the first conductive type semiconductor layer, a tunnel junction layer comprising a second conductive type nitride semiconductor layer and a first conductive type nitride semiconductor layer disposed on the active layer, wherein the first conductive type nitride semiconductor layer and the second conductive type nitride semiconductor layer are PN junctioned, a first electrode disposed on the first conductive type semiconductor layer, and a second electrode disposed on the first conductive type nitride semiconductor layer, wherein a portion of the second electrode is in schottky contact with the second conductive type nitride semiconductor layer through the first conductive type nitride semiconductor layer.

The second electrode may include a first contact part which is in ohmic contact with an upper surface of the first conductive type nitride semiconductor layer and a through portion of the first conductive type nitride semiconductor layer and a second contact part being in schottky contact with the second conductive type nitride semiconductor layer.

A portion of the second conductive type nitride semiconductor layer may be positioned between the second contact part and the active layer.

The tunnel junction layer may have at least one recess through which the second conductive type nitride semiconductor layer is exposed, and the second electrode may be disposed at the upper surface and lateral surface of the at least one recess.

A portion of the second electrode may be in schottky contact with the second conductive type nitride semiconductor layer exposed through the at least one recess.

A portion of the second electrode may be in ohmic contact with the first conductive type nitride semiconductor layer exposed through the at least one recess.

The second contact part and the second electrode may overlap in the vertical direction. The first conductive type nitride semiconductor layer may include a plurality of first conductive type clad layers having different concentrations and/or compositions of a first dopant. The second conductive type nitride semiconductor layer may include a plurality of second conductive type clad layers having different concentrations and/or compositions of a second dopant.

The active layer may emit light having a wavelength of 250 nm to 340 nm. The first electrode and the second electrode may be reflective electrodes comprising Al, Al/Ti or an Al alloy.

In another embodiment, a light emitting device includes a first conductive type semiconductor layer, an active layer disposed on the first conductive type semiconductor layer, a tunnel junction layer comprising a second conductive type nitride semiconductor layer and a first conductive type nitride semiconductor layer disposed on the active layer, wherein the first conductive type nitride semiconductor layer and the second conductive type nitride semiconductor layer are PN junctioned, a first electrode disposed on the first conductive type semiconductor layer, at least one recess formed in the tunnel junction layer and exposing the second conductive type nitride semiconductor layer through the at least one recess, a light transmitting dielectric layer filled in the at least one recess, and a second electrode disposed on the light transmitting dielectric layer and the first conductive type nitride semiconductor layer.

The light transmitting dielectric layer may overlap with the second electrode in the vertical direction. The first conductive type nitride semiconductor layer may include a plurality of first conductive type clad layers having different concentrations and/or compositions of a first dopant. The second conductive type nitride semiconductor layer may include a plurality of second conductive type clad layers having different concentrations and/or compositions of a second dopant.

In a further embodiment, a light emitting device package includes a submount, a first metal layer and a second metal layer disposed on the submount, a light emitting device disposed on the submount, a first bump unit to electrically interconnect the light emitting device and the first metal layer, and a second bump unit to electrically interconnect the light emitting device and the second metal layer, wherein the light emitting device is one of the light emitting device according to the embodiments.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
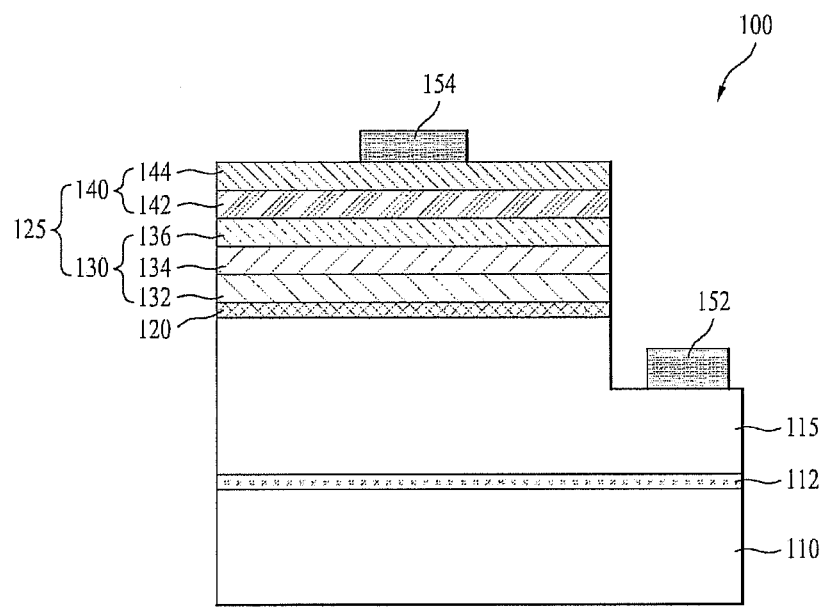
FIG. 1 is a sectional view showing a light emitting device according to a first embodiment.

Hereinafter, embodiments will be described with reference to the annexed drawings. It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

In the drawings, the sizes of respective layers are exaggerated, omitted, or schematically illustrated for convenience and clarity of description. Further, the sizes of the respective elements do not denote the actual sizes thereof. Also, wherever possible, the same reference numbers will be used throughout the drawings to refer to the same or like parts. Hereinafter, a light emitting device, light emitting device package, illumination apparatus and display apparatus according to embodiments will be described with reference to the annexed drawings.

FIG. 1 is a sectional view showing a light emitting device 100 according to a first embodiment. Referring to FIG. 1, the light emitting device 100 includes a substrate 110, a buffer layer 112, a first conductive type semiconductor layer 115, an active layer 120, a tunnel junction layer 125, a first conductive type first electrode 152, and a first conductive type second electrode 154.

The substrate 110 may be a light transmitting substrate. For example, the substrate 110 may be selected from a group consisting of a sapphire substrate ($Al_2O_3$), GaN, SiC, ZnO, Si, GaP, InP, $Ga_2O_3$, and GaAs. An irregular pattern may be formed at an upper surface of the substrate 110.

The buffer layer 112 is disposed between the substrate 110 and the first conductive type semiconductor layer 115. The buffer layer 112 may relieve stress caused due to differences in lattice constant and coefficient of thermal expansion between the substrate 110 and the first conductive type semiconductor layer 115. Since stress is relieved by the buffer layer 112, cracks due to stress are prevented from being generated in the first conductive type semiconductor layer 115, the active layer 120 disposed on the first conductive type semiconductor layer 115, and the tunnel junction layer 125.

The first conductive type semiconductor layer 115 is disposed between the buffer layer 112 and the active layer 120. The first conductive type semiconductor layer 115 may be a nitride semiconductor layer. The first conductive type semiconductor layer 115 may be a semiconductor layer having a formula of $In_xAl_yGa_{1-x-y}N$ ($0 \leq x \leq 1$, $0 \leq y \leq 1$, $0 \leq x+y \leq 1$) doped with an n type dopant (for example, Si, Ge or Sn). For example, the first conductive type semiconductor layer 115 may be selected from among InAlGaN, GaN, AlGaN, InGaN, AlN and InN, and may be doped with an n type dopant (for example, Si, Ge or Sn).

The active layer 120 is disposed on the first conductive type semiconductor layer 115. The active layer 120 may be formed of a III-V group element compound semiconductor material. The active layer 120 may be configured to have at least one selected from among a quantum wire structure, a quantum dot structure, a single quantum well (SQW) structure, and a multi quantum well (MQW) structure.

If the active layer 120 is configured to have a quantum well structure, the active layer 120 may include a well layer having a formula of $In_xAl_yGa_{1-x-y}N$ ($0 \leq x \leq 1$, $0 \leq y \leq 1$, $0 \leq x+y \leq 1$) and a barrier layer having a formula of $In_aAl_bGa_{1-a-b}N$ ($0 \leq a \leq 1$, $0 \leq b \leq 1$, $0 \leq a+b \leq 1$). The energy band gap of the well layer may be lower than that of the barrier layer.

The active layer 120 shown in FIG. 1 may emit light having a wavelength of 250 nm to 340 nm, i.e. deep ultraviolet (DUV) light.

The tunnel junction layer 125 includes a second conductive type nitride semiconductor layer 130 and a first conductive type nitride semiconductor layer 140. The second conductive type nitride semiconductor layer 130 and a first conductive type nitride semiconductor layer 140 may be PN junctioned.

The second conductive type nitride semiconductor layer 130 may have a formula of $In_xAl_yGa_{1-x-y}N$ ($0 \leq x \leq 1$, $0 \leq y \leq 1$, $0 \leq x+y \leq 1$) and doped with a second conductive type dopant (for example, Mg, Zn, Ca, Sr or Ba).

For example, the second conductive type nitride semiconductor layer 130 may be selected from among InAlGaN, GaN, AlGaN, InGaN, AlN and InN, and may be doped with a p type dopant (for example, Mg, Zn, Ca, Sr or Ba).

The second conductive type nitride semiconductor layer 130 may include a single layer or a plurality of layers. For example, the second conductive type nitride semiconductor layer 130 may include a plurality of second conductive type clad layers 132, 134 and 136. The second conductive type clad layers 132, 134 and 136 may have different concentrations and/or compositions of the second conductive type dopant.

For example, the second conductive type clad layer more distant from the active layer 120 may have higher concentration of the second conductive type dopant.

For example, the second conductive type nitride semiconductor layer 130 may include a p-AlGaN layer 132, p-GaN layer 134, and p+ GaN layer 136. Here, p+ may have higher dopant concentration than p.

The first conductive type nitride semiconductor layer 140 may have a formula of $In_xAl_yGa_{1-x-y}N$ ($0 \leq x \leq 1$, $0 \leq y \leq 1$, $0 \leq x+y \leq 1$) and doped with a first conductive type dopant. For example, the first conductive type nitride semiconductor layer 140 may be doped with an n type dopant (for example, Si, Ge or Sn) as the first conductive type dopant.

The first conductive type nitride semiconductor layer 140 may include a single layer or a plurality of layers. For example, the first conductive type nitride semiconductor layer 140 may include a plurality of first conductive type clad layers 142 and 144. The first conductive type clad layers 142 and 144 may have different concentrations and/or compositions of the first conductive type dopant. For example, the first conductive type clad layer closer from the active layer 120 may have higher dopant concentration.

For example, the first conductive type nitride semiconductor layer 140 may include an n+ GaN layer 142 and an n-GaN layer 144. Here, n+ may have higher dopant concentration than n.

The first conductive type first electrode 152 may be disposed on the first conductive type semiconductor layer 115. For example, the tunnel junction layer 125, the active layer 120, and the first conductive type semiconductor layer 115 may be etched so as to expose a portion of the first conductive type semiconductor layer 115. The first conductive type first electrode 152 may be disposed on the exposed portion of the first conductive type semiconductor layer 115. The first conductive type second electrode 154 may be disposed on the tunnel junction layer 125.

The first conductive type first electrode 152 may be in ohmic contact with the first conductive type semiconductor layer 115. The first conductive type second electrode 154 may be in ohmic contact with the first conductive type nitride semiconductor layer 140 of the tunnel junction layer 125.

The first conductive type first electrode 152 and the first conductive type second electrode 154 may be reflective electrodes formed of a reflective material that can be in ohmic contact with an n type nitride semiconductor layer. The first conductive type first electrode 152 and the first conductive type second electrode 154 may be in ohmic contact with an n type nitride semiconductor layer, and may be schottky contact with a p type nitride semiconductor layer.

For example, the first conductive type first electrode 152 and the first conductive type second electrode 154 may be formed of Al, Al/Ti or an Al alloy (for example, Ti/Al alloy). Since the first conductive type first electrode 152 and the first conductive type second electrode 154 may be formed using the same material at the same process, the number of deposition processes to form the electrodes can be reduced.

If reverse bias is applied to the tunnel junction layer 125 through the first conductive type first electrode 152 and the first conductive type second electrode 154, electrons in a valence band of the second conductive type nitride semiconductor layer 130 are tunneled to the first conductive type nitride semiconductor layer 140. As a result, holes are generated in the second conductive type nitride semiconductor layer 130, and the holes are injected into the active layer 120 by the reverse bias.

The active layer 120 may recombine the holes injected from the second conductive type nitride semiconductor layer 130 and the electrons injected from the first conductive type nitride semiconductor layer 140 to generate light.

Figure 9:
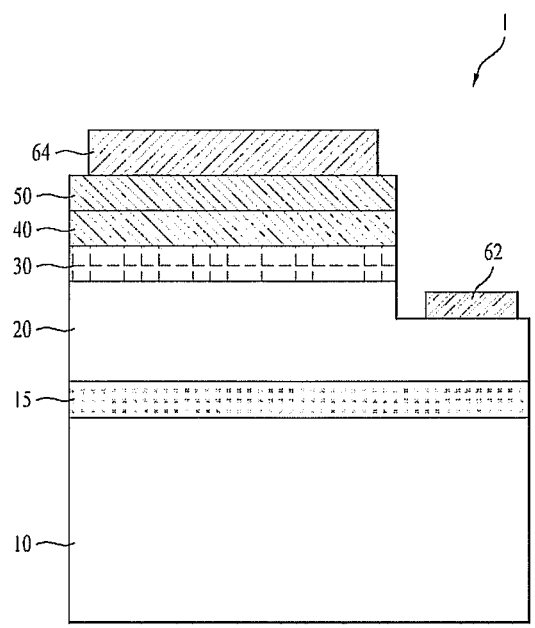
FIG. 9 is a view showing a general deep ultraviolet (DUV) light emitting device for flip chips.

FIG. 9 is a view showing a general horizontal DW light emitting device 1. Referring to FIG. 9, the light emitting device 1 includes a substrate 1, a buffer layer 15, an n type semiconductor (for example, n-GaN) layer 20, an active layer 30, p type semiconductor (for example, p-GaN) layers 40 and 50, a first electrode 62, and a second electrode 64.

In the horizontal DUV light emitting device 1, the p type semiconductor layers 40 and 50 are in ohmic contact with the second electrode 64. The second electrode 64, which functions as a reflective layer, is formed of Ni/Au or Ag.

However, p-GaN exhibits high absorptivity with respect to light having a wavelength of 360 nm or less, and silver (Ag) or gold (Au) exhibits low reflectance with respect to light having a wavelength of 360 nm or less.

Figure 5:
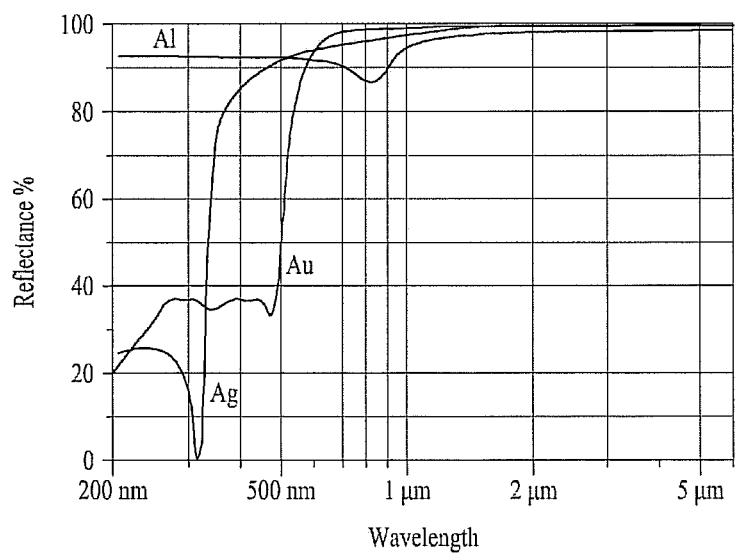
FIG. 5 is a view showing reflectance of aluminum, gold and silver based on wavelengths of light.

FIG. 5 is a view showing reflectance of aluminum (Al), gold (Au) and silver (Ag) based on wavelengths of light. Referring to FIG. 5, Au exhibits a reflectance of 40% or less with respect to light having a wavelength of 360 nm or less, and Ag exhibits a reflectance of 30% or less with respect to light having a wavelength of 360 nm or less. On the other hand, Al exhibits a reflectance of 90% or more with respect to light having a wavelength of 360 nm or less.

Aluminum (Al) is easily in ohmic contact with the first conductive type semiconductor (for example, n-GaN) layer but is not easily in ohmic contact with the second conductive type semiconductor (for example, p-GaN) layer.

Embodiments use aluminum (Al) or an aluminum alloy, exhibiting high reflectance with respect to DUV light, as materials constituting the electrodes 152 and 154. Embodiments have a structure having the tunnel junction layer 125 to easily achieve ohmic contact of the electrodes 152 and 154. In embodiments, therefore, reflectance and light extraction efficiency can be improved.

Figure 2:
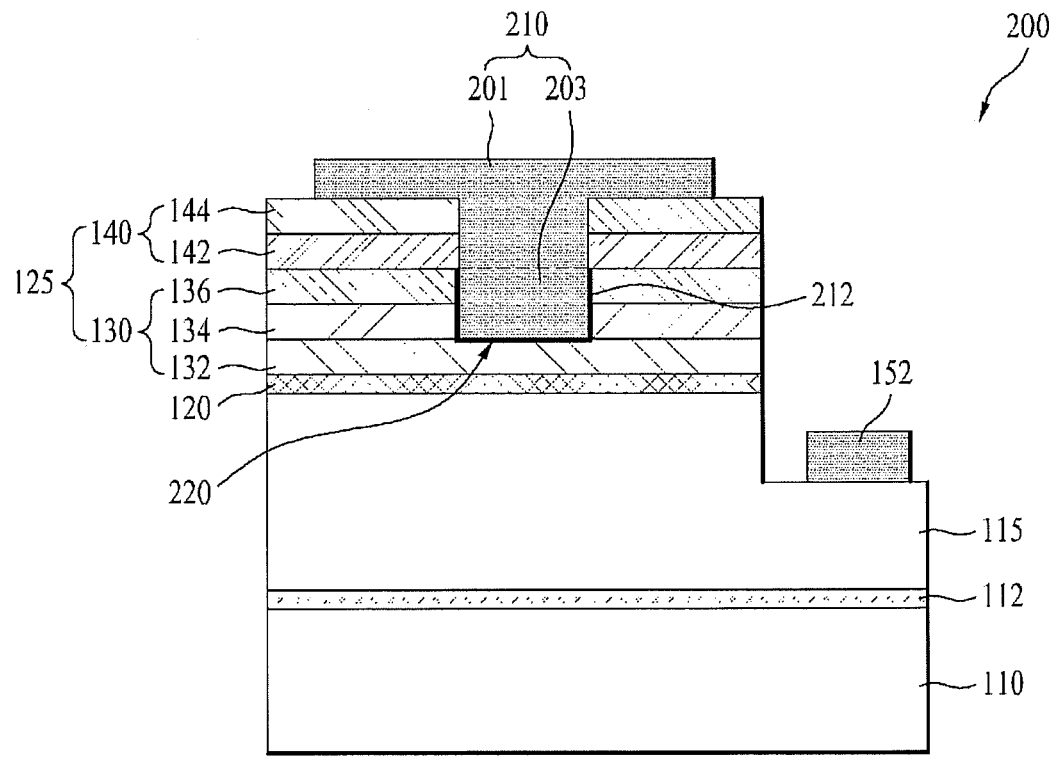
FIG. 2 is a sectional view showing a light emitting device according to a second embodiment.

FIG. 2 is a sectional view showing a light emitting device 200 according to a second embodiment. Components of the second embodiment identical to those of the first embodiment shown in FIG. 1 are denoted by the same reference numerals, and a duplicated description thereof will not be given.

Referring to FIG. 2, the light emitting device 200 includes a substrate 110, a buffer layer 112, a first conductive type semiconductor layer 115, an active layer 120, a tunnel junction layer 125, a first conductive type first electrode 152, and a first conductive type second electrode 210.

The tunnel junction layer 125 includes a second conductive type nitride semiconductor layer 130 and a first conductive type nitride semiconductor layer 140. The second conductive type nitride semiconductor layer 130 and a first conductive type nitride semiconductor layer 140 may be PN junctioned.

The first conductive type second electrode 210 may be disposed on the first conductive type nitride semiconductor layer 140. A portion of the first conductive type second electrode 210 may be in schottky contact with the second conductive type nitride semiconductor layer 130 through the first conductive type nitride semiconductor layer 140.

The first conductive type second electrode 210 may include a first contact part 201 and a second contact part 203 positioned under the first contact part 201. The first contact part 201 may be a part which is in ohmic contact with the upper surface of the first conductive type nitride semiconductor layer 140 and the through portion of the first conductive type nitride semiconductor layer 140. The second contact part 203 may be a part which is in schottky contact with the second conductive type nitride semiconductor layer 130 through the first conductive type nitride semiconductor layer 140. A portion of the second conductive type nitride semiconductor layer 130 is positioned between the second contact part 203 and the active layer 120. The second contact part 203 and the active layer 120 are spaced apart from each other so that the second contact part 203 and the active layer 120 do not contact each other.

The second conductive type nitride semiconductor layer 130 may include at least one second conductive type clad layer (for example, 132) positioned between the second contact part 203 and the active layer 120.

The tunnel junction layer 125 may have at least one recess 220, through which the second conductive type nitride semiconductor layer 130 is exposed. For example, the tunnel junction layer 125 may expose at least one of the second conductive type clad layers 132, 134 and 136.

A portion of the first conductive type second electrode 210 is disposed in the recess 220 so that the first conductive type second electrode 210 can be in ohmic contact with the portion of the first conductive type nitride semiconductor layer 140 exposed through the recess 220 and can be in schottky contact with the portion of the second conductive type nitride semiconductor layer 130 exposed through the recess 220. Current does not flow to a schottky contact interface 212 between the first conductive type second electrode 210 and the second conductive type nitride semiconductor layer 130. Consequently, the schottky contact interface 212 may function as a current blocking layer to prevent concentration of current.

In the second embodiment, current concentration is restrained by the schottky contact interface 212, thereby improving light emission efficiency of the light emitting device 200.

Figure 3:
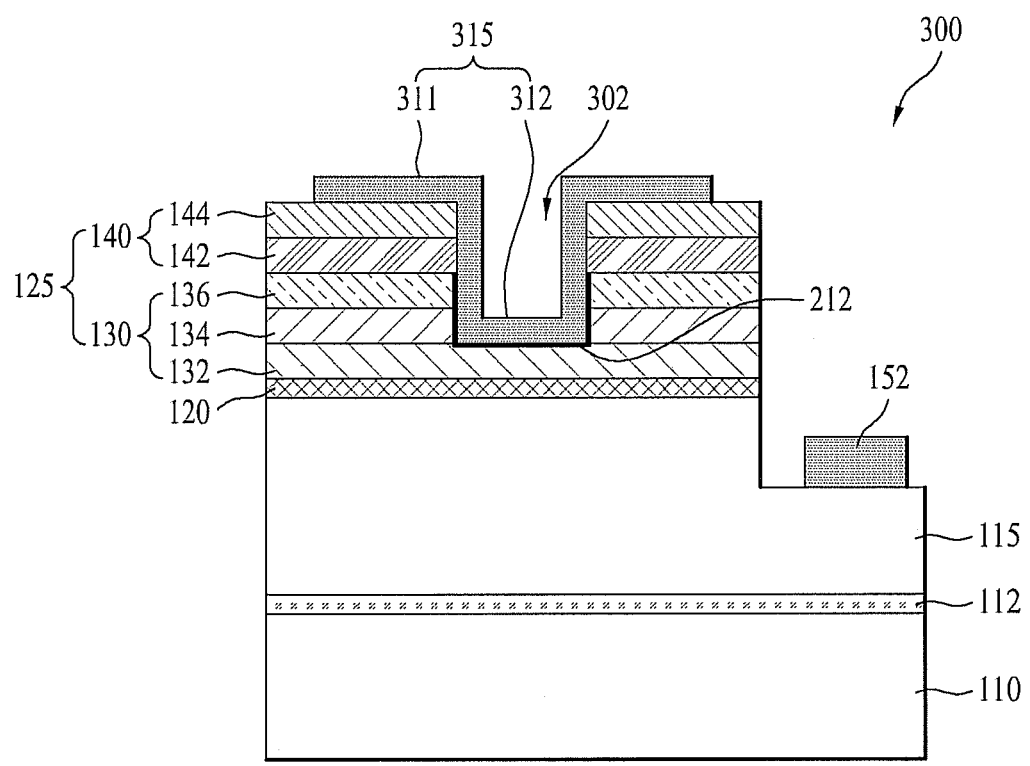
FIG. 3 is a sectional view showing a light emitting device according to a third embodiment.

FIG. 3 is a sectional view showing a light emitting device 300 according to a third embodiment. Components of the third embodiment identical to those of the first embodiment shown in FIG. 1 are denoted by the same reference numerals, and a duplicated description thereof will not be given.

Referring to FIG. 3, the light emitting device 300 includes a substrate 110, a buffer layer 112, a first conductive type semiconductor layer 115, an active layer 120, a tunnel junction layer 125, a first conductive type first electrode 152, and a first conductive type second electrode 315.

The tunnel junction layer 125 may have at least one recess 302, through which the second conductive type nitride semiconductor layer 130 is exposed. For example, at least one of the second conductive type clad layers 132, 134 and 136 may be exposed through the recess 302.

The first conductive type second electrode 315 is disposed on lateral surface and lower surface of the recess 302 and is disposed on the first conductive type nitride semiconductor layer 140. The first conductive type second electrode 315 may be in schottky contact with the exposed portion of the conductive type nitride semiconductor layer 130.

The first conductive type second electrode 315 may include a first contact part 311 and a second contact part 312.

The first contact part 311 may be in ohmic contact with the upper surface of the first conductive type nitride semiconductor layer 140 and the portion of the first conductive type nitride semiconductor layer 140 exposed through the recess 302.

The second contact part 312 may be in schottky contact with the portion of the second conductive type nitride semiconductor layer 130 exposed through the recess 302.

A portion of the second conductive type nitride semiconductor layer 130 is positioned between the second contact part 312 and the active layer 120. The second contact part 312 and the active layer 120 are spaced apart from each other so that the second contact part 312 and the active layer 120 do not contact each other. For example, at least one of the second conductive type clad layers 132, 134 and 136 may be positioned between the second contact part 312 and the active layer 120.

Current does not flow well to a schottky contact interface 212 between the first conductive type second electrode 315 and the second conductive type nitride semiconductor layer 130. Consequently, the schottky contact interface 212 may function as a current blocking layer to prevent concentration of current. In the third embodiment, therefore, current concentration is restrained by the schottky contact interface 212, thereby improving light emission efficiency of the light emitting device 300.

Furthermore, in the second and third embodiments, the tunnel junction layers 125 having the recess 220 and 301 have a thickness less than that of the other parts. Consequently, light absorptivity is low, and reflectance of the first conductive type second electrodes 210 and 310 is improved, thereby improving light extraction efficiency.

In the second and third embodiments, therefore, light emission efficiency and reflectance are improved as compared with the first embodiment.

Figure 4:
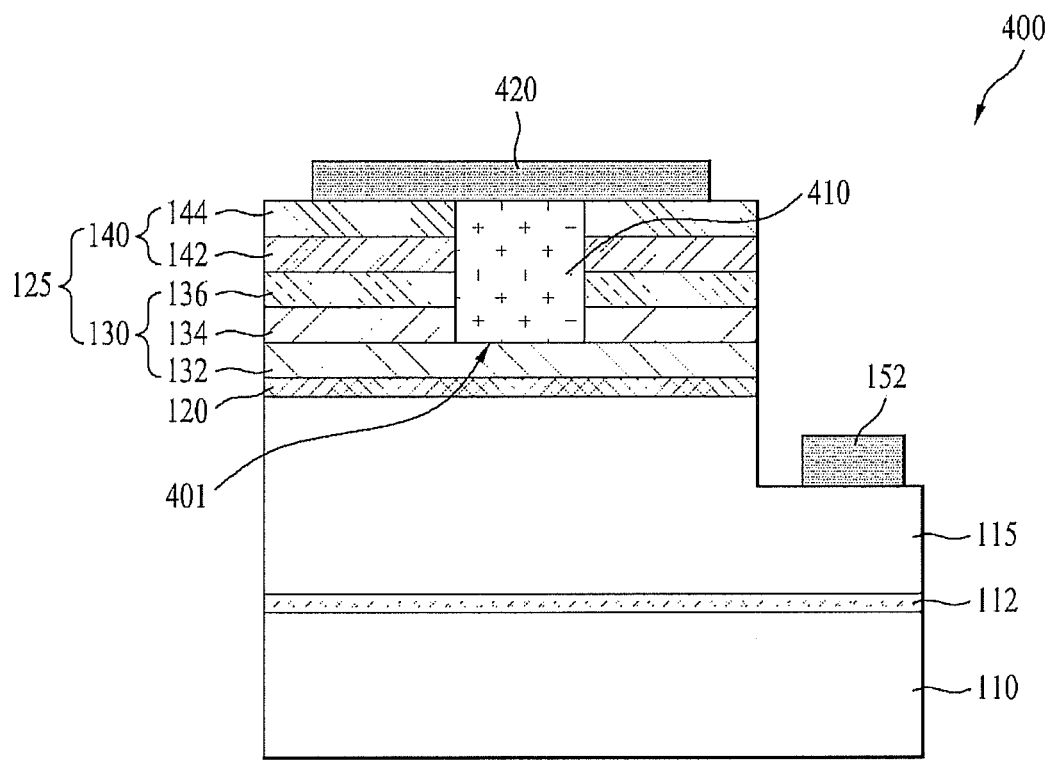
FIG. 4 is a sectional view showing a light emitting device according to a fourth embodiment.

FIG. 4 is a sectional view showing a light emitting device 400 according to a fourth embodiment. Components of the fourth embodiment identical to those of the first embodiment shown in FIG. 1 are denoted by the same reference numerals, and a duplicated description thereof will not be given.

Referring to FIG. 4, the light emitting device 400 includes a substrate 110, a buffer layer 112, a first conductive type semiconductor layer 115, an active layer 120, a tunnel junction layer 125, a dielectric layer 410, a first conductive type first electrode 152, and a first conductive type second electrode 420.

The tunnel junction layer 125 may have at least one recess 401. The second conductive type nitride semiconductor layer 130 may be exposed through the recess 401. For example, at least one of the second conductive type clad layers 132, 134 and 136 may be exposed through the recess 401.

At least one second conductive type clad layer (for example, 132) may be positioned between the lower surface of the recess 401 and the active layer 120. Alternatively, at least one of the first conductive type clad layers 142 and 144 and the second conductive type nitride semiconductor layer 130 may be positioned between the lower surface of the recess 401 and the active layer 120.

The recess 401 is filled with the dielectric layer 410. The dielectric layer 410 may be a light transmitting insulating material including at least one selected from among $SiO_2$, SiNx, $TiO_2$, $Ta_2O_3$, SiON and SiCN.

The first conductive type second electrode 420 is disposed on the tunnel junction layer 125 and the dielectric layer 410. For example, the first conductive type second electrode 420 may be disposed on the first conductive type nitride semiconductor layer 140 and the dielectric layer 410. At least a portion of the first conductive type second electrode 420 may overlap with the dielectric layer 410 in the vertical direction. The vertical direction may be a direction from the first conductive type semiconductor layer 115 to the tunnel junction layer 125. The first conductive type second electrode 420 may be in ohmic contact with the first conductive type nitride semiconductor layer 140.

Current does not flow through the dielectric layer 410 under the first conductive type second electrode 420. Consequently, the dielectric layer 410 may function as a current blocking layer to prevent concentration of current. In the fourth embodiment, therefore, current concentration is restrained by the dielectric layer 410, thereby improving light emission efficiency of the light emitting device 400.

Figure 6:
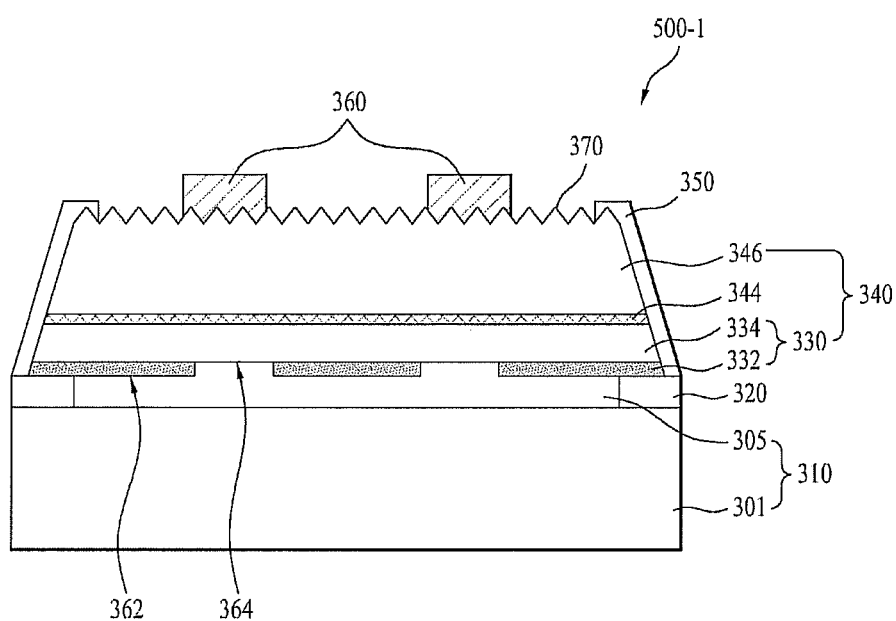
FIG. 6 is a sectional view showing a light emitting device according to a fifth embodiment.

FIG. 6 is a sectional view showing a light emitting device 500-1 according to a fifth embodiment. Referring to FIG. 6, the light emitting device 500-1 includes a second electrode layer 310, a protection layer 320, a light emitting structure 340, a passivation layer 350, and a first electrode 360.

The second electrode layer 310 may support the light emitting structure 340 and may supply first power (for example, negative power) to the light emitting structure 340. The second electrode layer 310 may include a support layer 301 and a reflective layer 305.

The support layer 301 may be a metal layer including at least one selected from among copper (Cu), tungsten (W) and molybdenum (Mo). Alternatively, the support layer 301 may include at least one selected from among Si, Ge, GaAs, ZnO and SiC.

The reflective layer 305 may be disposed between the support layer 301 and the light emitting structure 340. The reflective layer 305 may be formed of a metal or metal alloy including at least one selected from among Ag, Ni, Al, Rh, Pd, Ir, Ru, Mg, Zn, Pt, Au and Hf.

A bonding layer (not shown) is disposed between the support layer 301 and the reflective layer 305. The bonding layer may function to prevent diffusion of metal ions from the support layer 301 and bond the support layer 301 and the reflective layer 305. For example, the bonding layer may include at least one selected from among Ti, Au, Sn, Ni, Cr, Ga, In, Bi, Cu, Ag and Ta.

The protection layer 320 is disposed on the edge of the second electrode layer 310. For example, the protection layer 320 may be disposed on the edge of the support layer 301. Alternatively, the protection layer 320 may be disposed on the edge of the reflective layer 305.

The protection layer 320 prevents the light emitting structure 340 and the second electrode layer 310 from being separated from each other at the interface therebetween during isolation etching of the light emitting structure 340 for unit chip division, thereby preventing deterioration in reliability of the light emitting device 500-1. The protection layer 320 may be formed of an electrically dielectric material, such as ZnO, $SiO_2$, $Si_3N_4$, TiOx (x is a positive real number) or $Al_2O_3$.

The light emitting structure 340 is disposed on the second electrode layer 310. The lateral surface of the light emitting structure 340 may be inclined during isolation etching of the light emitting structure 340 for unit chip division.

The light emitting structure 340 includes a tunnel junction layer 330, an active layer 344, and a first conductive type semiconductor layer 346.

A tunnel junction layer 330 includes a first conductive type nitride semiconductor layer 332 and a second conductive type nitride semiconductor layer 334. The first conductive type nitride semiconductor layer 332 and the second conductive type nitride semiconductor layer 334 may be PN junctioned.

Here, the first conductive type nitride semiconductor layer 332 may be identical to the first conductive type nitride semiconductor layer 140 shown in FIG. 1, and the second conductive type nitride semiconductor layer 334 may be identical to the second conductive type nitride semiconductor layer 130 shown in FIG. 1. Although not shown in FIG. 6, therefore, the first conductive type nitride semiconductor layer 332 may include a plurality of first conductive type clad layers, e.g. an n+ GaN layer land an n-GaN layer. Also, the second conductive type nitride semiconductor layer 334 may include a plurality of second conductive type clad layers, e.g. a p-AlGaN layer, p-GaN layer, and p+ GaN layer.

The second electrode layer 310 may be in ohmic contact with the first conductive type nitride semiconductor layer 332. For example, the reflective layer 305 may be in ohmic contact with the first conductive type nitride semiconductor layer 332.

A portion of the second electrode layer 310 may be in schottky contact with the second conductive type nitride semiconductor layer 334 through the first conductive type nitride semiconductor layer 332.

For example, a portion of the reflective layer 305 may be in schottky contact with the second conductive type nitride semiconductor layer 334 through the first conductive type nitride semiconductor layer 332.

The second electrode layer 310 may include a first contact part 362 and a second contact part 364. For example, the reflective layer 305 may include the first contact part 362 and the second contact part 364.

The first contact part 362 may be a part which is in ohmic contact with one surface of the first conductive type nitride semiconductor layer 332 and the through portion of the first conductive type nitride semiconductor layer 332. The second contact part 364 may be a part which is in schottky contact with the second conductive type nitride semiconductor layer 334 through the first conductive type nitride semiconductor layer 332.

The second conductive type nitride semiconductor layer 334 may be positioned between the second contact part 364 and the active layer 344. The second contact part 364 and the active layer 344 do not contact each other. That is, at least one of the second conductive type clad layers may be positioned between the second contact part 364 and the active layer 344. The second contact part 364 may overlap with the first electrode 360 in the vertical direction. The vertical direction may be a direction from the first conductive type semiconductor layer 346 to the tunnel junction layer 330.

Current does not flow to a schottky contact interface between the second electrode layer 310 and the second conductive type nitride semiconductor layer 334. Consequently, the second contact part 364 may function as a current blocking layer to prevent concentration of current.

In the fifth embodiment, current concentration is restrained by the second contact part 364, thereby improving light emission efficiency of the light emitting device 500-1.

The passivation layer 350 wraps the lateral side of the light emitting structure 340 to electrically protect the light emitting structure 340. The passivation layer 350 may contact the protection layer 320. The passivation layer 350 may be formed of a light transmitting dielectric material, such as $SiO_2$, $SiO_x$, $SiO_xN_y$, $Si_3N_4$ or $Al_2O_3$.

The active layer 344 and the first conductive type semiconductor layer 346 may be identical to those shown in FIG. 1. The surface of the first conductive type semiconductor layer 346 may have roughness 370 to improve light extraction efficiency.

Figure 7:
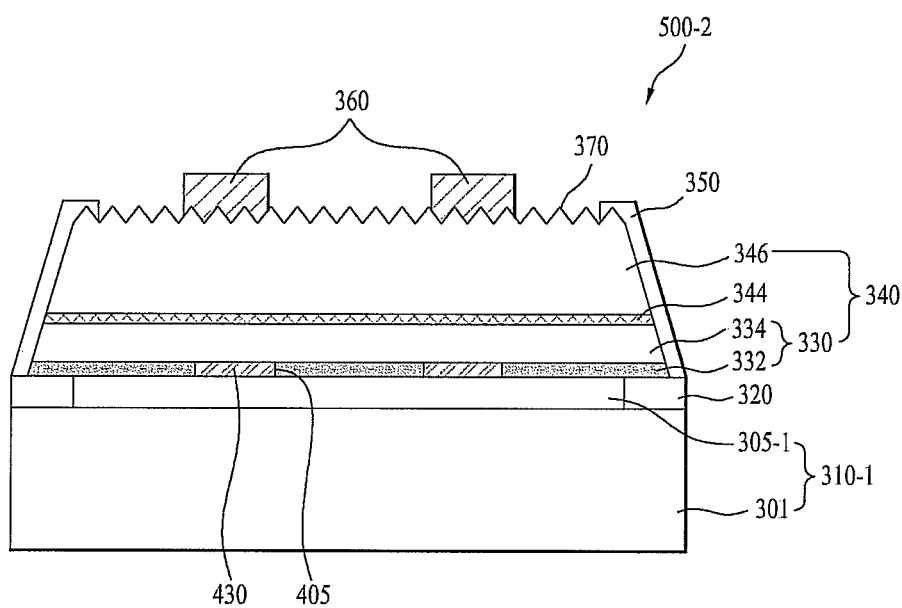
FIG. 7 is a sectional view showing a light emitting device according to a sixth embodiment.

FIG. 7 is a sectional view showing a light emitting device 500-2 according to a sixth embodiment. Components of the sixth embodiment identical to those of the fifth embodiment shown in FIG. 6 are denoted by the same reference numerals, and a duplicated description thereof will not be given.

Referring to FIG. 7, the light emitting device 500-2 includes a second electrode layer 310-1, a protection layer 320, a dielectric layer 430, a light emitting structure 340, a passivation layer 350, and a first electrode 360.

The second electrode layer 310-1 includes a support layer 301 and a reflective layer 305-1. The support layer 301 may be in ohmic contact with a first conductive type nitride semiconductor layer 332. For example, the reflective layer 305-1 may be in ohmic contact with a first conductive type nitride semiconductor layer 332.

A tunnel junction layer 330 may have at least one recess 405. A second conductive type nitride semiconductor layer 334 may be exposed through the recess 405. Alternatively, at least one of first conductive type clad layers may be exposed through the recess 405.

At least one second conductive type clad layer may be positioned between the recess 405 and an active layer 344. Alternatively, at least one of the first conductive type clad layers and the second conductive type nitride semiconductor layer 334 may be positioned between the recess 405 and the active layer 344.

The recess 405 is filled with the dielectric layer 430. The dielectric layer 430 may include at least one selected from among $SiO_2$, SiNx, $TiO_2$, $Ta_2O_3$, SiON and SiCN. At least a portion of the dielectric layer 430 may overlap with the first electrode 360 in the vertical direction.

The dielectric layer 430 is positioned between the second electrode layer 310-1 and the second conductive type nitride semiconductor layer 334. Current does not flow through the dielectric layer 430. Consequently, the dielectric layer 430 may function as a current blocking layer to prevent concentration of current. In the sixth embodiment, therefore, current concentration is restrained by the dielectric layer 430, thereby improving light emission efficiency of the light emitting device 500-2.

Figure 8:
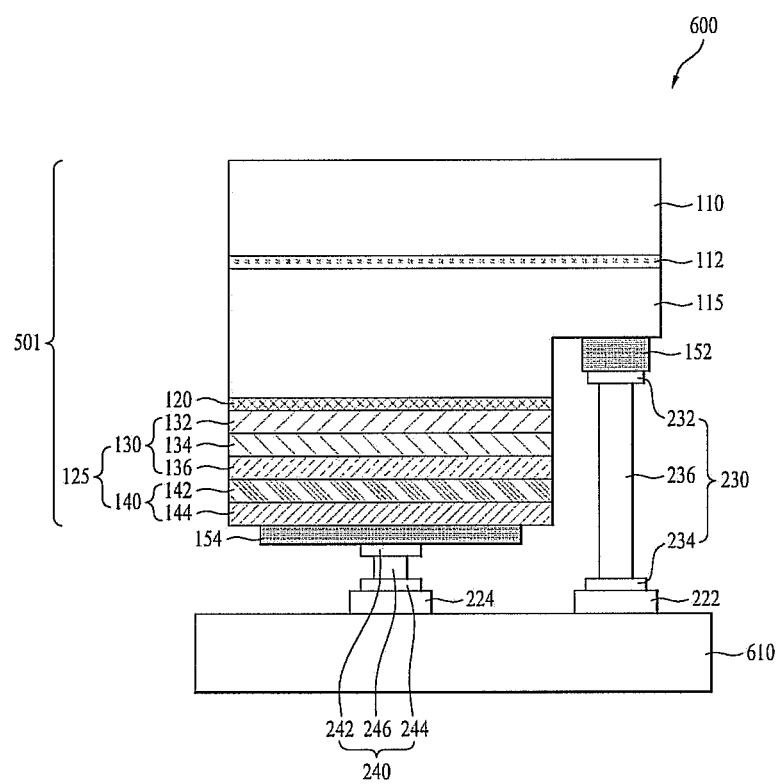
FIG. 8 is a sectional view showing a light emitting device package according to an embodiment.

FIG. 8 is a sectional view showing a light emitting device package 600 according to an embodiment. Components of this embodiment identical to those of the first embodiment shown in FIG. 1 are denoted by the same reference numerals, and a duplicated description thereof will not be given.

Referring to FIG. 8, the light emitting device package 600 includes a submount 610, a light emitting device 501, a first metal layer 222, a second metal layer 224, a first bump unit 230, and a second bump unit 240.

The submount 610 is provided to mount the light emitting device 501 thereon. The submount 610 may be realized using a package body or a printed circuit board. The submount 610 may be configured in various forms which the light emitting device 501 can be flip chip bonded to.

The light emitting device 501 is mounted on the submount 610. The light emitting device 501 may be electrically connected to the submount 610 via the first bump unit 230 and the second bump unit 240.

The light emitting device 501 shown in FIG. 8 may be the light emitting device according to the first embodiment. However, the light emitting device 501 is not limited thereto. The light emitting device 501 may be one of the light emitting devices according to the second to fourth embodiments. In FIG. 8, the light emitting device shown in FIG. 1 is shown in an overturned state.

The submount 610 is disposed under a first conductive type first electrode 152 and a first conductive type second electrode 154. That is, the first conductive type first electrode 152 and the first conductive type second electrode 154 may be disposed so as to face the submount 610.

The submount 610 may include a resin such as polyphthalamide (PPA), liquid crystal polymer (LCP), polyamide 9T (PA9T), a metal, photosensitive glass, sapphire, ceramic or a printed circuit board. However, the submount 610 according to this embodiment is not limited thereto.

The first metal layer 222 and the second metal layer 224 are disposed at the upper surface of the submount 610 so that the first metal layer 222 and the second metal layer 224 can be electrically separated from each other. Here, the upper surface of the submount 610 may be surface opposite the light emitting device 501.

The first metal layer 222 and the first conductive type first electrode 152 may be aligned in the vertical direction, and the second metal layer 224 and the first conductive type second electrode 154 may be aligned in the vertical direction. Here, the vertical direction may be a direction from the submount 610 to the light emitting device 501.

The first bump unit 230 and the second bump unit 240 may be disposed on the submount 610 so that the first bump unit 230 and the second bump unit 240 can be electrically separated from each other. The first bump unit 230 may be disposed between the first conductive type first electrode 152 and the first metal layer 222 to electrically interconnect the first conductive type first electrode 152 and the first metal layer 222. The second bump unit 240 may be disposed between the first conductive type second electrode 154, 210, 310 or 420 and the second metal layer 224 to electrically interconnect the first conductive type second electrode 154, 210, 310 or 420 and the second metal layer 224.

The first bump unit 230 may include a first diffusion prevention bonding layer 232, a first bumper 236, and a second diffusion prevention bonding layer 234. The first bumper 236 may be disposed between the first conductive type first electrode 152 and the first metal layer 222 to electrically interconnect the first conductive type first electrode 152 and the first metal layer 222.

The first diffusion prevention bonding layer 232 may be disposed between the first conductive type first electrode 152 and the first bumper 236 to bond the first conductive type first electrode 152 and the first bumper 236. The first diffusion prevention bonding layer 232 may improve bonding force between the first bumper 236 and the first conductive type first electrode 152 and prevent ions contained in the first bumper 236 from penetrating or diffusing into a first conductive type semiconductor layer 115 through the first conductive type first electrode 152.

The second diffusion prevention bonding layer 234 may be disposed between the first bumper 236 and the first metal layer 222 to bond the first bumper 236 and the first metal layer 222. The second diffusion prevention bonding layer 234 may improve bonding force between the first bumper 236 and the first metal layer 222 and prevent ions contained in the first bumper 236 from penetrating or diffusing into the submount 610 through the first metal layer 222.

The second bump unit 240 may include a third diffusion prevention bonding layer 242, a second bumper 246, and a fourth diffusion prevention bonding layer 244. The second bumper 246 may be disposed between the first conductive type second electrode 154 and the second metal layer 224 to electrically interconnect the first conductive type second electrode 154 and the second metal layer 224.

The third diffusion prevention bonding layer 242 may be disposed between the first conductive type second electrode 154 and the second bumper 246 to bond the first conductive type second electrode 154 and the second bumper 246. The third diffusion prevention bonding layer 242 may improve bonding force between the second bumper 246 and the first conductive type second electrode 154 and prevent ions contained in the second bumper 246 from penetrating or diffusing into a tunnel junction layer 125 through the first conductive type second electrode 154.

The fourth diffusion prevention bonding layer 244 may be disposed between the second bumper 246 and the second metal layer 224 to bond the second bumper 246 and the second metal layer 224. The fourth diffusion prevention bonding layer 244 may improve bonding force between the second bumper 246 and the second metal layer 224 and prevent ions contained in the second bumper 246 from penetrating or diffusing into the submount 610 through the second metal layer 224.

The first to fourth diffusion prevention bonding layers 232, 234, 242 and 244 may be formed of at least one selected from among Pt, Ti, W/Ti and Au or an alloy thereof. The first bumper 236 and the second bumper 246 may include at least one selected from among titanium (Ti), copper (Cu), nickel (Ni), gold (Au), chrome (Cr), tantalum (Ta), platinum (Pt) and tin (Sn).

The light emitting device package 600 includes a light emitting device 501 including a first conductive type first electrode 152 and a first conductive type second electrode 154, which are formed of aluminum or an aluminum alloy exhibiting high reflectance with respect to DUV light. The light emitting device 501 includes a tunnel junction layer 125 having a PN junction to easily achieve ohmic contact between the first conductive type first electrode 152 and the first conductive type second electrode 154. In the light emitting device package 600, therefore, reflectance with respect to light having a wavelength of 250 nm to 340 nm is improved, and light extraction efficiency is improved.

A plurality of light emitting device packages 600, one of which is shown in FIG. 8, may be arranged on a board. An optical member, such as a light guide plate, a prism sheet, or a diffusion sheet, may be disposed on an optical path of the light emitting device package 600. The light emitting device package, the substrate, and the optical member may function as a backlight unit.

In other embodiments, a display apparatus, indication apparatus and illumination system including the light emitting device or the light emitting device package according to one of the previous embodiments may be realized. For example, the illumination system may include a lamp and a streetlight.

Figure 10:
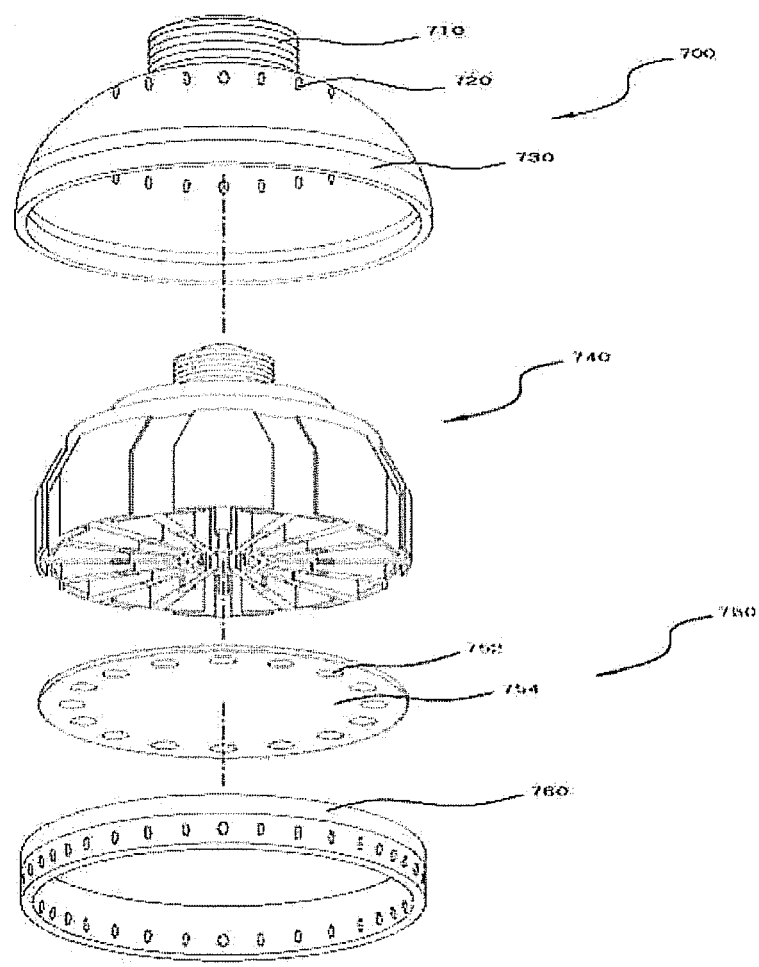
FIG. 10 is an exploded perspective view showing an illumination apparatus according to an embodiment.

FIG. 10 is an exploded perspective view showing an illumination apparatus according to an embodiment.

Referring to FIG. 10, the illumination apparatus includes a light source 750, a housing 700 in which the light source 750 is mounted, a heat sink 740 to dissipate heat from the light source 750, and a holder 760 to couple the light source 75.0 and the heat sink 740 to the housing 700.

The housing 700 includes a socket coupling part 710 coupled to an electrical socket (not shown) and a body part 730, connected to the socket coupling part 710, in which the light source 750 is mounted. The body part 730 may have an air flow hole 720.

Alternatively, a plurality of air flow holes 720 may be formed in the body part 730 of the housing 700. That is, one or more air flow holes 720 may be provided. The air flow holes 720 may be arranged at the body part 730 in a radial manner or in various other manners.

The light source 750 includes a plurality of light emitting device packages 752 provided on a board 753. The board 754 may be formed in a shape that can be inserted into an opening of the housing 700. As described below, the board 754 may be formed of a material exhibiting high thermal conductivity to transfer heat to the heat sink 740. Each of the light emitting device packages may be one of the previous embodiments.

The holder 760 is provided under the light source 750. The holder 760 may have a frame and another air flow hole. Also, although not shown, an optical member may be provided under the light source 750 to diffuse, scatter or converge light emitted from the light emitting device packages 752 of the light source 750.

Figure 11A:
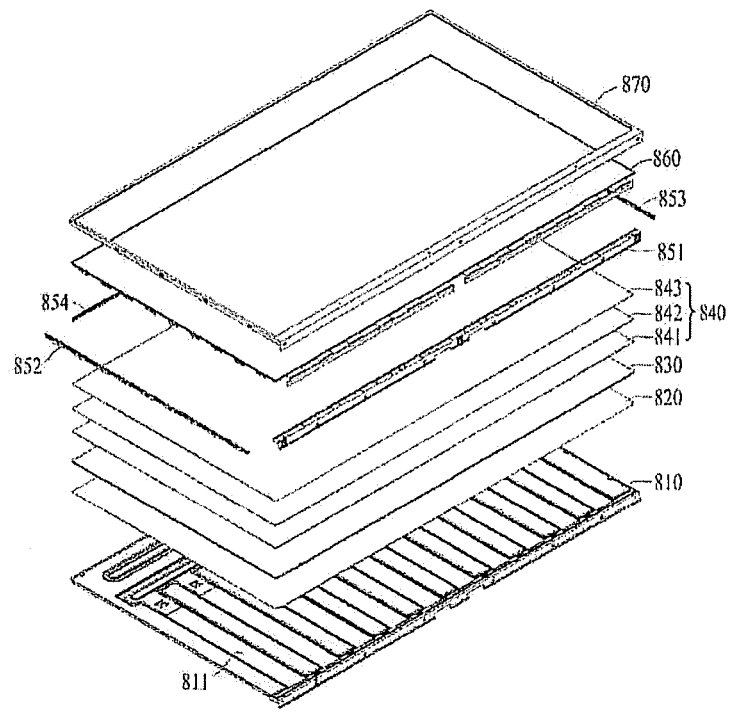
FIG. 11A is a view showing a display apparatus including a light emitting device package according to an embodiment.
Figure 11B:
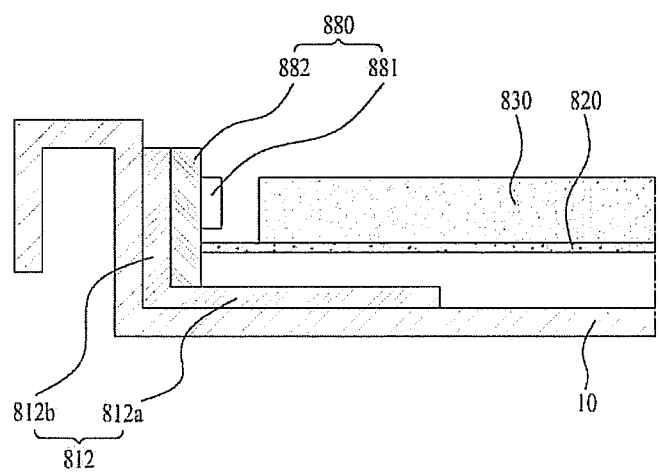
FIG. 11B is a sectional view showing a light source of the display apparatus shown in FIG. 11A.

FIG. 11A is a view showing a display apparatus including a light emitting device package according to an embodiment, and FIG. 11B is a sectional view showing a light source of the display apparatus shown in FIG. 11A.

Referring to FIGS. 11A and 11B, the display apparatus includes a backlight unit, a liquid crystal display panel 860, a top cover 870 and a fixing member 850.

The backlight unit includes a bottom cover 810, a light emitting module 880 provided in the bottom cover 810 at one side thereof, a reflection plate 820 disposed at the front of the bottom cover 810, a light guide plate 830 disposed in front of the reflection plate 820 to guide light emitted from the light emitting module 880 to the front of the display apparatus, and an optical member 840 disposed in front of the light guide plate 830. The liquid crystal display panel 860 is disposed in front of the optical member 840. The top cover 870 is provided in front of the liquid crystal display panel 860. The fixing member 850 is disposed between the bottom cover 810 and the top cover 870 to fix the bottom cover 810 and the top cover 870.

The light guide plate 830 functions to guide light emitted from the light emitting module 880 so that the light can be emitted in a surface emitting manner. The reflection plate 820, disposed at the rear of the light guide plate 830, functions to reflect light emitted from light emitting module 880 toward the light guide plate 830, thereby improving light efficiency. Although the reflection plate 820 is provided as a separate component as shown in the drawing, the rear of the light guide plate 830 or the front of the bottom cover 810 may be coated with a material exhibiting high reflectance to form the reflection plate 820. The reflection plate 820 may be formed of a material that exhibits high reflectance and can be formed in a very thin shape. For example, the reflection plate 820 may be formed of polyethylene terephthalate (PET).

The light guide plate 830 scatters light emitted from the light emitting module 880 so that the light can be uniformly distributed over the light crystal display panel. To this end, the light guide plate 830 is formed of a material exhibiting high index of refraction and transmissivity. For example, the light guide plate 830 may be formed of polymethylmethacrylate (PMMA), polycarbonate (PC) or polyethylene (PE).

The optical member 840 is provided on the light guide plate 830 to diffuse light emitted from the light guide plate 830 at a predetermined angle. Light guided by the light guide plate 830 is uniformly irradiated to the liquid crystal display panel 860 by the optical member 840. An optical sheet, such as a diffusion sheet, a prism sheet or a protection sheet, may be selectively stacked to constitute the optical member 840. Alternatively, a micro lens array may be used. A plurality of optical sheets may be used. The optical sheet may be formed of a transparent resin, such as an acryl resin, a polyurethane resin or a silicone resin. A fluorescent sheet may be included in the prism sheet.

The liquid crystal display panel 860 may be provided at the front of the optical member 840. Other kinds of display apparatuses requiring a light source may be provided in addition to the liquid crystal display panel 860. The reflection plate 820 is disposed on the bottom cover 810, and the light guide plate 830 is disposed on the reflection plate 820. As a result, the reflection plate 820 may directly contact a heat sink (not shown). The light emitting module 880 includes a light emitting device package 881 and a printed circuit board 882. The light emitting device package 881 is mounted on the printed circuit board 882. The light emitting device package shown in FIG. 8 may be used as the light emitting device package 881.

The printed circuit board 882 may be bonded to a bracket 812. The bracket 812 fixes the light emitting device package 881. The bracket 812 may be formed of a material exhibiting high thermal conductivity to dissipate heat. Although not shown, a heat pad may be provided between the bracket 812 and the light emitting device package 881 to easily achieve heat transfer. As shown in the drawing, the bracket 812 is formed in an L shape so that a horizontal portion 812a can be supported by the bottom cover 810 and a vertical portion 812b can fix the printed circuit board 882.

As is apparent from the above description, embodiments provide a light emitting device and a light emitting device package with improved reflectance and optical extraction efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductivity type semiconductor layer doped with a first conductivity type dopant;
an active layer disposed on the first conductivity type semiconductor layer;
a tunnel junction layer including a second conductivity type nitride semiconductor layer disposed on the active layer and a first conductivity type nitride semiconductor layer disposed on the second conductivity type nitride semiconductor layer, wherein the first conductivity type nitride semiconductor layer and the second conductivity type nitride semiconductor layer are PN junctioned;
a first electrode disposed on the first conductivity type semiconductor layer; and
a second electrode disposed on the first conductivity type nitride semiconductor layer, wherein a portion of the second electrode is in schottky contact with the second conductivity type nitride semiconductor layer through the first conductivity type nitride semiconductor layer,
wherein the second electrode comprises:
a first contact portion in ohmic contact with an upper surface of the first conductivity type nitride semiconductor layer and a through portion of the first conductivity type nitride semiconductor layer; and
a second contact portion in schottky contact with the second conductivity type nitride semiconductor layer.

2. The light emitting device according to claim 1, wherein a portion of the second conductivity type nitride semiconductor layer is positioned between the second contact portion and the active layer.

3. The light emitting device according to claim 1, wherein the tunnel junction layer has at least one recess through which the second conductivity type nitride semiconductor layer is exposed, and
the second electrode is disposed on an upper surface and a lateral surface of the at least one recess.

4. The light emitting device according to claim 3, wherein a portion of the second electrode is in schottky contact with the second conductivity type nitride semiconductor layer exposed through the at least one recess.

5. The light emitting device according to claim 3, wherein a portion of the second electrode is in ohmic contact with the first conductivity type nitride semiconductor layer exposed through the at least one recess.

6. The light emitting device according to claim 1, wherein the first conductivity type nitride semiconductor layer includes a plurality of first conductivity type clad layers having different concentrations and/or compositions of a first dopant.

7. The light emitting device according to claim 6, wherein the second type nitride semiconductor layer includes a plurality of second conductivity type clad layers having different concentrations and/or compositions of a second dopant.

8. The light emitting device according to claim 1, wherein the active layer emits light having a wavelength of 250 nm to 340 nm.

9. The light emitting device according to claim 1, wherein the first electrode and the second electrode are reflective electrodes comprising Al, Al/Ti or an Al alloy.

10. A light emitting device package comprising:
a submount;
a first metal layer and a second metal layer disposed on the submount;
a light emitting device disposed on the submount;
a first bump unit electrically interconnecting the light emitting device and the first metal layer; and
a second bump unit electrically interconnecting the light emitting device and the second metal layer, wherein the light emitting device comprises:
a light transmitting substrate;
a first conductive type semiconductor layer disposed on the light transmitting substrate;
an active layer disposed on the first conductive type semiconductor layer;
a tunnel junction layer comprising a second conductive type nitride semiconductor layer and a first conductive type nitride semiconductor layer disposed on the active layer, wherein the first conductive type nitride semiconductor layer and the second conductive type nitride semiconductor layer are PN junctioned;
a first electrode disposed on the first conductive type semiconductor layer; and
a second electrode disposed on the first conductive type nitride semiconductor layer, wherein a portion of the second electrode is in schottky contact with the second conductive type nitride semiconductor layer through the first conductive type nitride semiconductor layer.

11. The light emitting device package according to claim 10, wherein the active layer of the light emitting device emits light having a wavelength of 250 nm to 340 nm.

12. The light emitting device package according to claim 10, wherein the first electrode and the second electrode are reflective electrodes comprising Al, Al/Ti or an Al alloy.

* * * * *